United States Patent
Holm et al.

(10) Patent No.: US 9,318,376 B1
(45) Date of Patent: Apr. 19, 2016

(54) THROUGH SUBSTRATE VIA WITH DIFFUSED CONDUCTIVE COMPONENT

(71) Applicant: FREESCALE SEMICONDUCTOR, INC., Austin, TX (US)

(72) Inventors: Paige M Holm, Phoenix, AZ (US); Lianjun Liu, Chandler, TX (US); Ruben B. Montez, Cedar Park, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/570,029

(22) Filed: Dec. 15, 2014

(51) Int. Cl.
  *H01L 21/44* (2006.01)
  *H01L 21/768* (2006.01)
  *H01L 23/522* (2006.01)
  *H01L 23/532* (2006.01)

(52) U.S. Cl.
  CPC .... *H01L 21/76805* (2013.01); *H01L 21/76814* (2013.01); *H01L 21/76825* (2013.01); *H01L 21/76826* (2013.01); *H01L 21/76828* (2013.01); *H01L 23/5226* (2013.01); *H01L 23/53271* (2013.01)

(58) Field of Classification Search
  USPC .......................................................... 438/667
  See application file for complete search history.

(56) References Cited

U.S. PATENT DOCUMENTS

| | | | |
|---|---|---|---|
| 7,276,787 B2 | 10/2007 | Edelstein et al. | |
| 7,564,115 B2 | 7/2009 | Chen et al. | |
| 8,940,636 B2 * | 1/2015 | Pagaila | H01L 21/568 257/678 |
| 2006/0282309 A1 * | 12/2006 | Zhang | G06Q 30/02 705/14.1 |
| 2007/0042563 A1 | 2/2007 | Wang et al. | |
| 2007/0161235 A1 * | 7/2007 | Trezza | H01L 21/6835 438/667 |
| 2010/0224965 A1 | 9/2010 | Kuo et al. | |
| 2012/0326319 A1 | 12/2012 | Yu et al. | |
| 2013/0015504 A1 | 1/2013 | Kuo et al. | |
| 2015/0061084 A1 * | 3/2015 | Tsai | H01S 5/0208 257/621 |

FOREIGN PATENT DOCUMENTS

| | | |
|---|---|---|
| CN | 1791975 B | 5/2012 |
| WO | 2012144951 A1 | 10/2012 |

* cited by examiner

*Primary Examiner* — Asok K Sarkar

(57) ABSTRACT

A front-end-of-line through-substrate via is provided for application in certain semiconductor device fabrication, including microelectromechanical (MEMS) devices. The through-substrate via (TSV) has a conductive element formed from the cylindrical core of a ring-shaped isolating etch trench. The conductivity of the core is provided by in-diffusion of dopants from a highly-doped layer deposited along sidewalls of the core within the etched trench. The highly-doped layer used as the diffusion source can be either conductive or insulating, depending upon the application. The highly-doped diffusion source layer can be retained after diffusion to further contribute to the conductivity of the TSV, to help fill or seal the via, or can be partially or completely removed. Embodiments provide for the drive in-diffusion process to use a same heating step as that used for thermal oxidation to fill or seal the via trench. Other embodiments can provide for diffusion elements from a gaseous source.

15 Claims, 9 Drawing Sheets

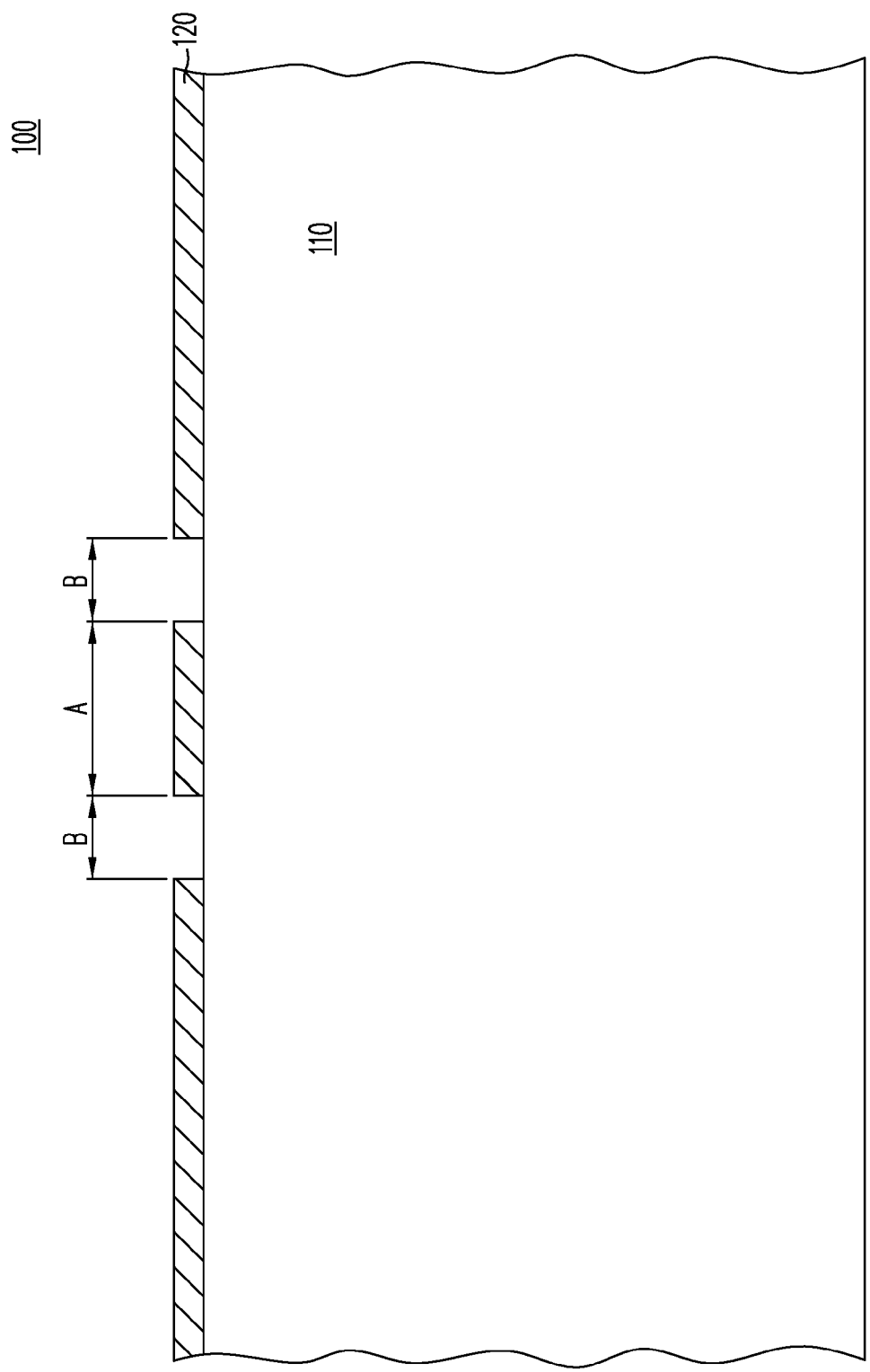

THROUGH SUBSTRATE VIA WITH DIFFUSED CONDUCTIVE COMPONENT

BACKGROUND

1. Field

This disclosure relates generally to semiconductor device fabrication, and more specifically, to providing a front-end-of-line through-substrate via for application in MEMS sensor products.

2. Related Art

In semiconductor device fabrication, it is often desirable to be able to communicate signals from one surface of a substrate on which the semiconductor device is fabricated to the other surface. Such signals are communicated using through-substrate vias (TSV), which are conductive paths provided in the substrate. An example of semiconductor devices that use such TSVs are microelectromechanical devices, such as accelerometers, pressure sensors, and gyroscopes, and chip scale packages.

Typically, TSVs have been made by either drilling and depositing conductive material in the hole made in the substrate, or have been made by using a conductive substrate (e.g., highly-doped silicon) and electrically isolating a region of the conductive substrate to act as a TSV. These methods have drawbacks in that they either add steps to the process for fabricating the semiconductor device, use a higher cost, highly doped substrate as a starting material, or utilize geometries that compromise performance.

It is therefore desirable to be able to form TSVs in a way that uses less expensive, non-doped substrates, and can be used with minimal disruption to fabrication processes.

BRIEF DESCRIPTION OF THE DRAWINGS

The present invention may be better understood, and its numerous objects, features, and advantages made apparent to those skilled in the art by referencing the accompanying drawings.

FIG. 1A is a simplified block diagram illustrating a cross-section of a structure 100 used during fabrication of one example of a TSV in a semiconductor device, in accordance with embodiments of the present invention.

The use of the same reference symbols in different drawings indicates identical items unless otherwise noted. The figures are not necessarily drawn to scale.

DETAILED DESCRIPTION

Figure 1B:
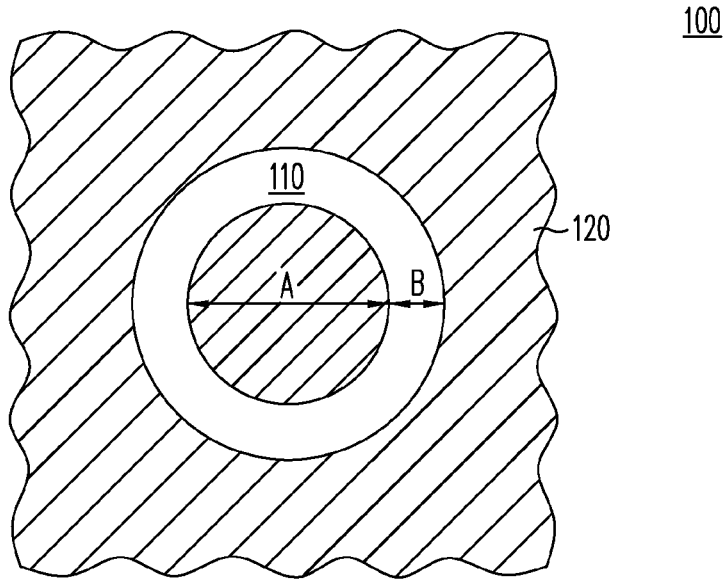
FIG. 1B is a plan view of the top of the structure illustrated in FIG. 1A.

Embodiments of the present invention provide a front-end-of-line through-substrate via for application in certain semiconductor device fabrication, including microelectromechanical (MEMS) devices. The through-substrate via (TSV) has a conductive element formed from the cylindrical core of a ring-shaped isolating etch trench. The conductivity of the core is provided by in-diffusion of dopants from a highly-doped layer deposited along sidewalls of the core within the etched trench. The highly-doped layer used as the diffusion source can be either conductive or insulating, depending upon the application. The highly-doped diffusion source layer can be retained after diffusion to further contribute to the conductivity of the TSV, to help fill or seal the via, or can be partially or completely removed. Embodiments provide for the drive in-diffusion process to use a same heating step as that used for thermal oxidation to fill or seal the via trench. Other embodiments can provide for diffusion elements from a gaseous source.

In order to efficiently provide TSVs for semiconductor devices, such as MEMS devices, it is important to form the TSVs using low cost, low conductivity substrates such as those used for those devices. In addition, given the thicknesses of the substrates used for those devices, the structures formed for the TSVs will have a high aspect ratio (e.g., height of the structure/width of the structure). In addition, it is desirable to provide as clean a transmission of signal as possible, and this means a minimal resistance (e.g., less than 100 ohm) and minimal parasitic capacitance. It is further desirable to minimize voiding along the structural seams created during the fabrication of the TSVs, because voids can create performance and reliability issues, especially near the conductive region. Finally, the better the TSV fabrication process fits into the overall device fabrication process, the less expensive it is to use the TSV fabrication process.

FIG. 1A is a simplified block diagram illustrating a cross-section of a structure 100 during fabrication of one example of a TSV in a semiconductor device, in accordance with embodiments of the present invention. A substrate 110 is used, which will be the base for formation of the semiconductor device. Embodiments of the present invention anticipate use of a low conductivity crystalline silicon substrate, having a conductivity of around 6-10 ohm-cm. In some embodiments, the substrate can be formed of an n-type silicon, but other types of substrates can be used within the scope of the present invention. For example, a p-type silicon substrate can be used, but due to lower charge carrier mobility in p-type silicon, it is preferable to use n-type silicon. In addition, other types of substrate materials (e.g., GaAs) can be used in certain embodiments, depending upon the application.

Substrate 110 is illustrated with a masking layer 120 formed on the top major surface. Masking layer 120 is a hard mask applicable for use with deep reactive-ion etching processes, and can include materials such as silicon dioxide and silicon nitride. The hard mask is patterned to provide a ring geometry having an inner disk of diameter A and an outer annulus having a width B. Diameter A will be the diameter of a cylindrical pillar formed after etching, and the diameter will be in a range of 10-25 µm and more commonly 15-25 µm. Experimentally, it has been found that 10 µm is a practical lower limit of diameter A, as the cylindrical structure can be fragile at these diameters. On the other hand, 25 µm is at about a limit for the diffusion processes discussed below. Width B of the annulus region is in a range of 4-8 µm, with a nominal width of 5 µm, which both allows for more uniform deposition and fill, as will be discussed more fully below.

FIG. 1B is a plan view of the top of structure 100. As can be seen in the figure, masking layer 120 is etched to provide a ring structure having an inner diameter A and an outer diameter A+2B. The etched ring exposes the surface of substrate 110, which can then be subject to etching processes discussed below.

Figure 2:
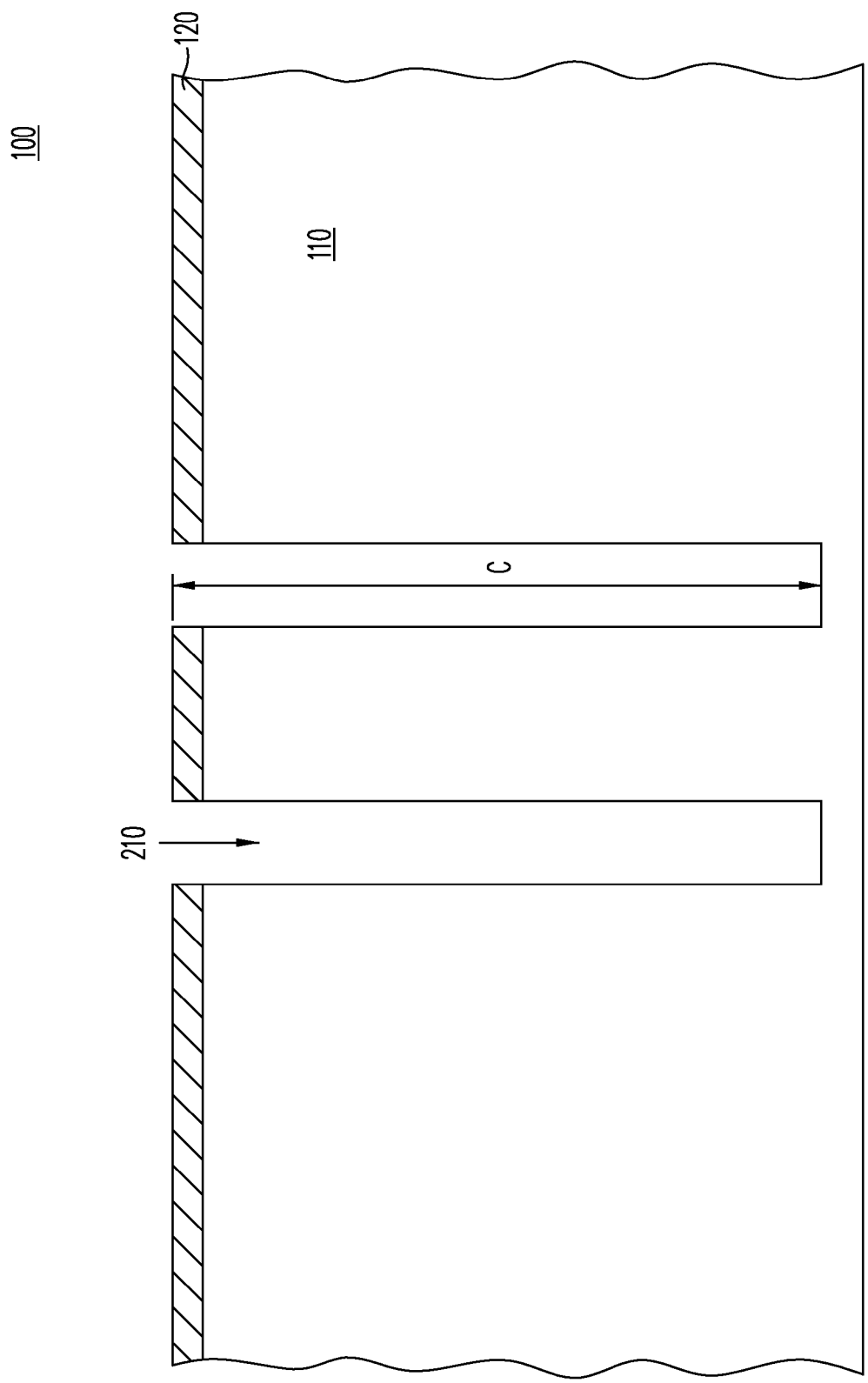
FIG. 2 is a simplified block diagram illustrating a cross-section of structure 100 in a step subsequent to that of FIG. 1 during fabrication of one example of the TSV, in accordance with embodiments of the present invention.

FIG. 2 is a simplified block diagram illustrating a cross-section of structure 100 in a step subsequent to that of FIG. 1 during fabrication of one example of the TSV, in accordance with embodiments of the present invention. An etching process is used to form a ring-shaped, or annular, trench 210 having a depth C. In order to form a ring-shaped trench having a cylindrical core such as that illustrated, a deep reactive-ion etch (DRIE) process known in the art is used. DRIE processes are commonly used to form deep penetration trenches that have steep sides in semiconductor wafers and substrates, and can provide high aspect ratio structures such as that anticipated for the TSVs of embodiments of the present invention. It is anticipated that depth C will be on the order of 150 µm, resulting in a cylindrical core structure having an aspect ratio on the order of 10-15. The depth C will be approximately the length of the resulting TSV in the substrate, after polishing and grind back processing such as that described below.

Figure 3:
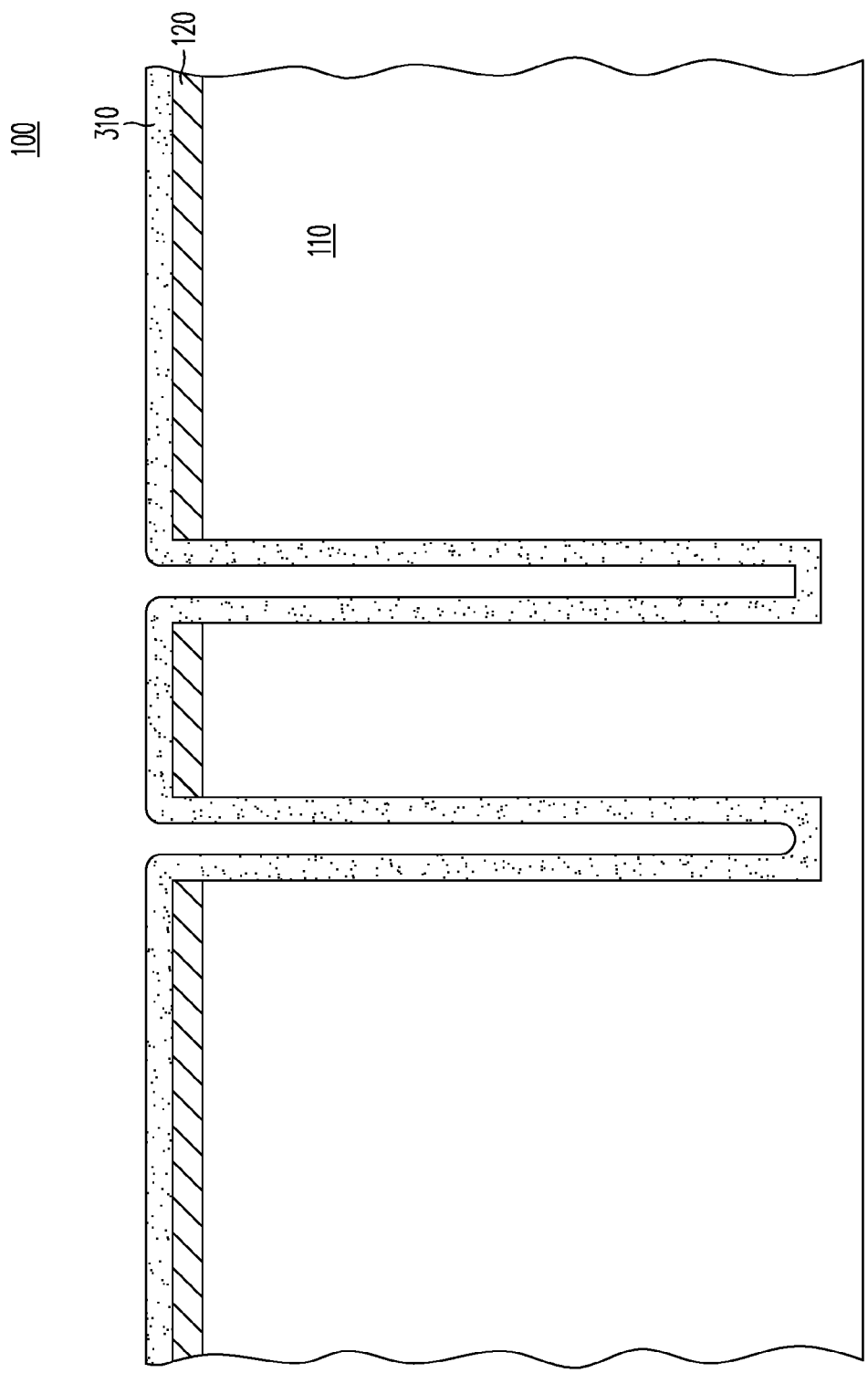
FIG. 3 is a simplified block diagram illustrating a cross-section of structure 100 in a step subsequent to that of FIG. 2 during fabrication of one example of the TSV, in accordance with embodiments of the present invention.

FIG. 3 is a simplified block diagram illustrating a cross-section of structure 100 in a step subsequent to that of FIG. 2 during fabrication of one example of the TSV, in accordance with embodiments of the present invention. A highly-doped source layer 310 is formed on the exposed surfaces of structure 100, including the sides and bottom of ring-shaped trench 210. Source layer 310 can include poly-silicon or silicon oxide that is highly doped (e.g., above $2\,e^{19}$ cm$^{-3}$). In the case of an n-type substrate, the dopant in source layer 310 is n+ (e.g., arsenic or phosphorus), similarly for a p-type substrate the dopant in the source layer is p-type. Source layer 310 can be formed using a low-pressure chemical vapor deposition (LPCVD) process that results in a 2-3 µm layer for poly-silicon or 1-2 µm for oxide.

Figure 4B:
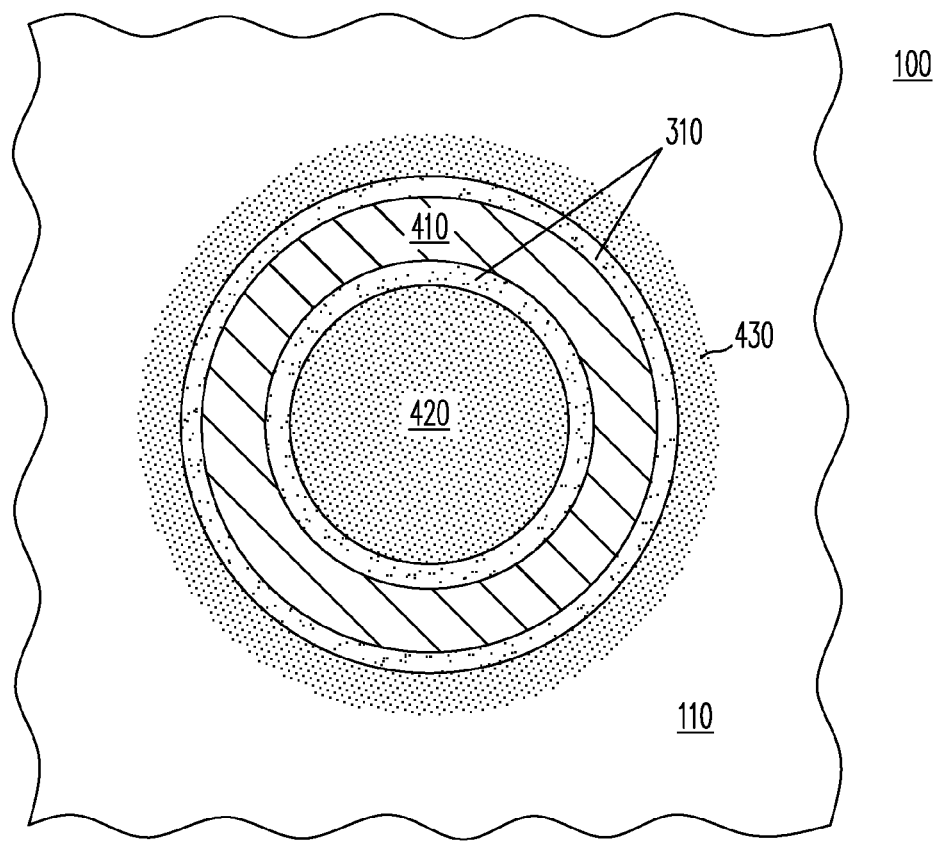
FIG. 4B is a simplified block diagram illustrating a plan view slice of substrate 110, showing the ring structure after the drive-in diffusion illustrated in FIG. 4A.
Figure 4A:
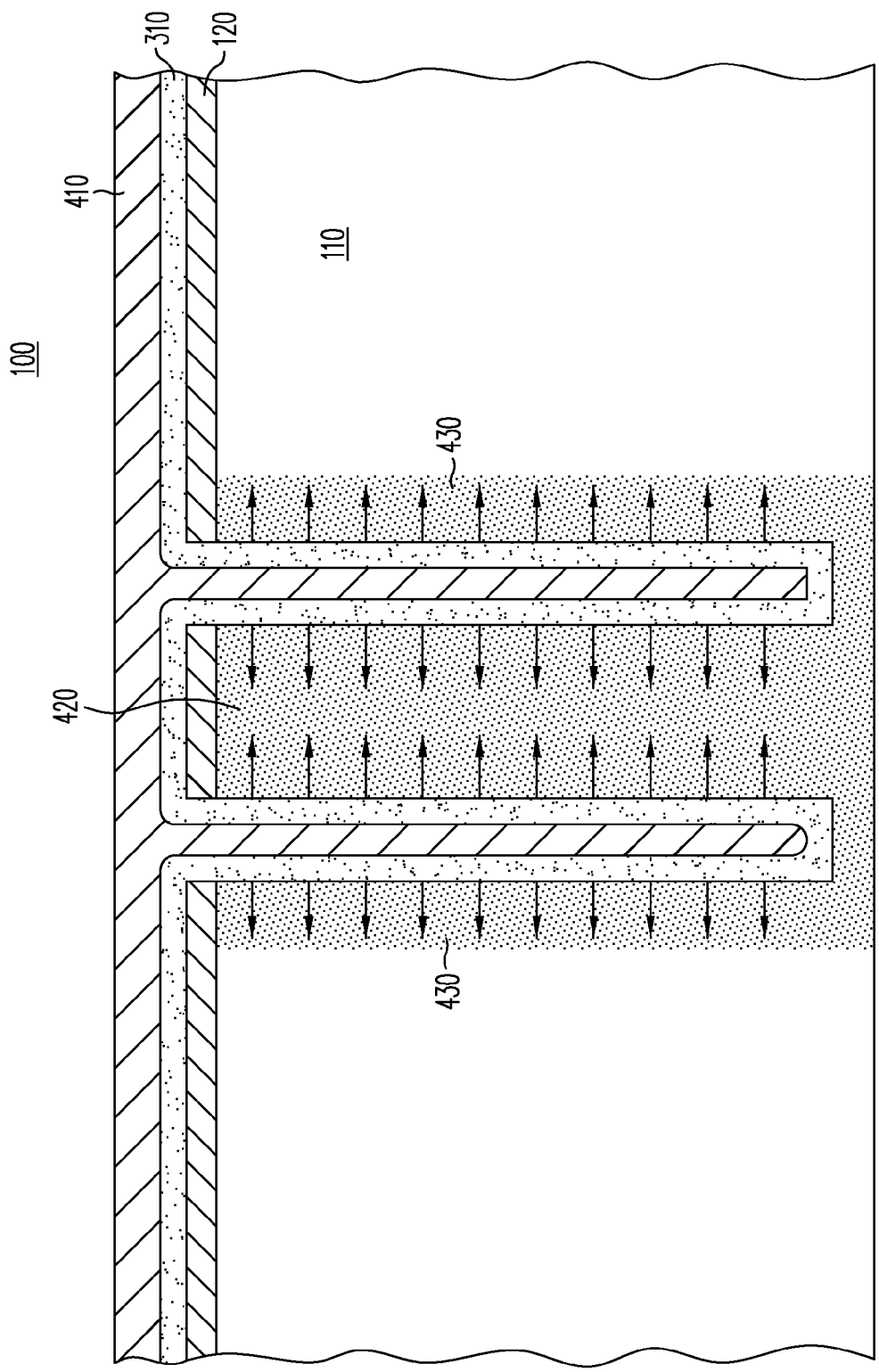
FIG. 4A is a simplified block diagram illustrating a cross-section of structure 100 in a step subsequent to that of FIG. 3 during fabrication of one example of the TSV, in accordance with embodiments of the present invention.

FIG. 4A is a simplified block diagram illustrating a cross-section of structure 100 in a step subsequent to that of FIG. 3 during fabrication of one example of the TSV, in accordance with embodiments of the present invention. In this step, a thermal oxide layer 410 is grown on source layer 310. Thermal oxide layer 410 is grown not only on the top surface but also in the gap between opposing source layers in ring-shaped trench 210. Thermal oxide layer 410 is typically grown at a temperature of about 1000 C over a period of 6-24 hours, depending upon the desired thickness of the oxide layer. During this period, the heating will also result in a drive-in diffusion of the dopant in source layer 310 to region 420 of the cylindrical core structure as well as region 430 surrounding ring-shaped trench 210. Some or all of the doped polysilicon will be consumed during this process, resulting in a uniform, or near uniform, distribution of dopant throughout region 420. Doping region 420 will result in making the cylindrical region conductive. Higher levels of diffused dopant will result in high conductivity in that region (i.e., lower resistance). Performing the diffusion during the lengthy thermal oxidation step used to grow the via isolation material and to fill the trench means that no additional process steps are required for the diffusion.

In some applications, however, the cylindrical core structure may be of a diameter too large to result in a near uniform dopant distribution in region 420 if drive-in diffusion only occurs during thermal oxide grown. In such cases, it can be desirable to include an additional drive-in diffusion step, prior to the thermal oxide growth step, in which structure 100 is subjected to a temperature of about 1100 C in a nitrogen environment. This step can be performed to begin the process of diffusing dopant into region 420. In some embodiments, this heating can be performed for four hours or so. Diffusion can then continue through the thermal oxidation step. The combination of heating steps can result in a more uniform distribution of dopants throughout region 420.

FIG. 4B is a simplified block diagram illustrating a plan view slice of substrate 110, showing the ring structure after the drive-in diffusion illustrated in FIG. 4A. Region 420, in the center cylindrical crystalline silicon structure, is shown surrounded by a ring of highly doped polysilicon 310. Surrounding the ring of highly doped polysilicon is an insulative ring region of thermal oxide 410. Surrounding thermal oxide region 410 is a second ring region of highly doped polysilicon 310. Finally, surrounding the second ring region of highly doped polysilicon 310 is a doped region 430 in substrate 110. Doped region 430 results from drive-in diffusion of the dopant from highly-doped region 310 along the outer side of trench 210. Doped region 430 will also have a higher level of conductivity than the remainder of substrate 110.

By filling the trench with thermal oxide region 410 after having formed the highly-doped region 310, a seam produced by the growth of the thermal oxide growing toward the center of the trench from the sidewalls is separate from the conductive center cylindrical core. This can result in lower and more stable resistance and greater reliability of the formed structure. Further, growing a thermal oxide on a polysilicon layer (e.g., highly doped region 310) is a faster process than growing a thermal oxide directly on a crystalline silicon, and thereby reduces the length of thermal oxide step.

Figure 5:
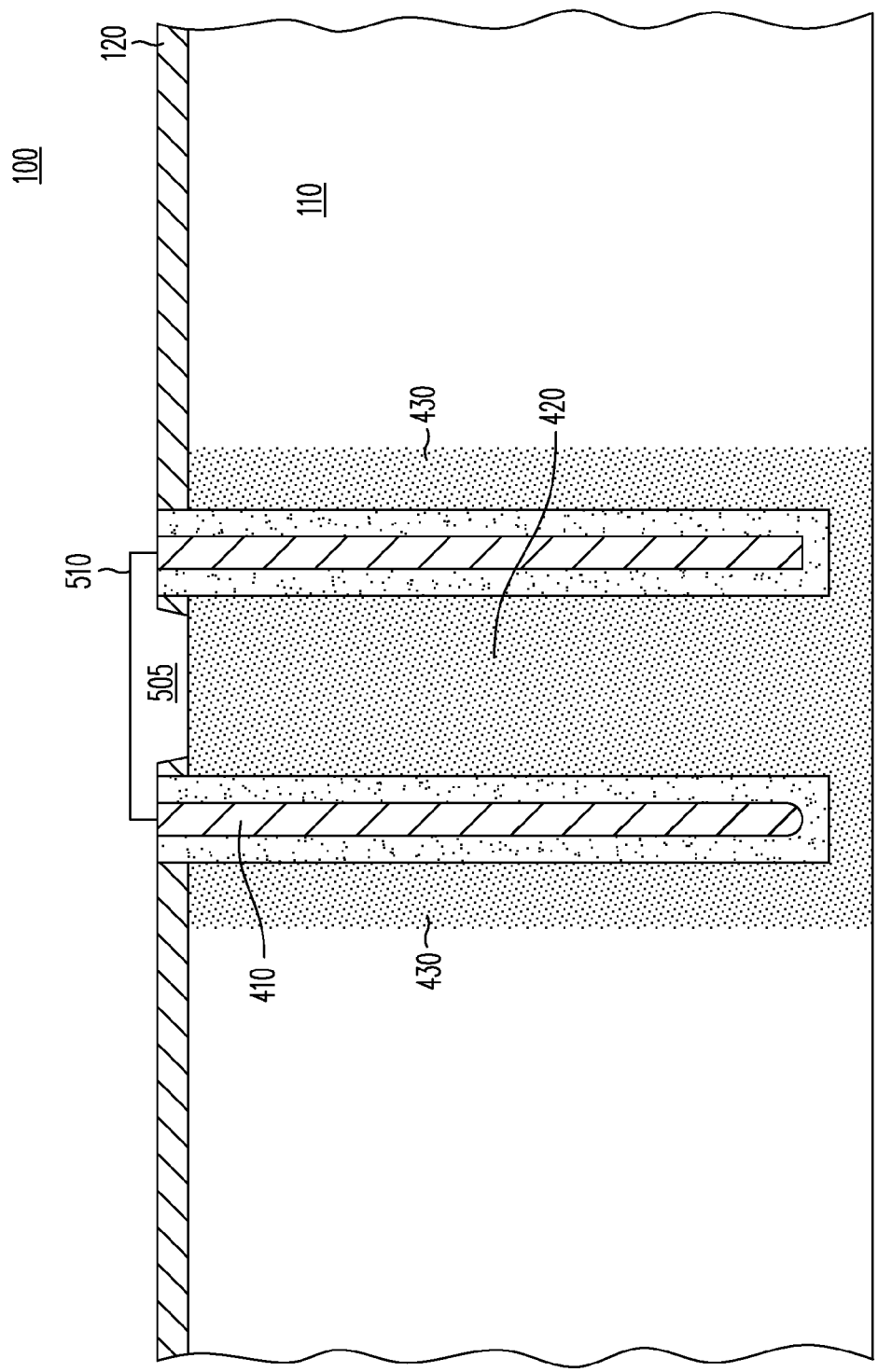
FIG. 5 is a simplified block diagram illustrating a cross-section of structure 100 in a step subsequent to that of FIG. 4A during fabrication of one example of the TSV, in accordance with embodiments of the present invention.

FIG. 5 is a simplified block diagram illustrating a cross-section of structure 100 in a step subsequent to that of FIG. 4A during fabrication of one example of the TSV, in accordance with embodiments of the present invention. The top surface is polished back to at least masking layer 120. At this level, a conductive ring of highly doped region 310 may be exposed, if diffusion was not performed to deplete the entire region. To make a contact with the now-doped cylindrical core, an etch may be performed to remove a portion of hard mask layer 120 to create opening 505. A conductive layer 510 can then be formed over opening 505, thereby creating a contact to the conductive material in region 420 of the cylindrical core. Opening 505 is of a diameter sufficient to ensure contact with the more highly doped regions of region 420 (e.g., toward the outer region of the cylindrical core). Alternatively, polishing can be performed to expose the top of region 420, and a conductive layer 510 can be formed on top of region 420, creating a contact. But in this embodiment, an insulative layer is deposited to isolate the conductive layer from the substrate.

Conductive layer 510 can include a material such as amorphous silicon, polysilicon, a metal-containing material, another suitable material, and the like, or any combination thereof. In one embodiment, the material of layer 510 can include platinum, palladium, iridium, osmium, ruthenium, rhenium, indium-tin, indium-zinc, aluminum-tin, or any combination thereof. Conductive layer 510 can have a thickness of between approximately 30 and approximately 200 nm and can be grown or deposited using a conventional or proprietary technique, such as a CVD technique, PVD technique, the like, or any combination thereof. In one embodiment, conductive layer 510 is doped with an n-type species such as arsenic or phosphorus.

Figure 6:
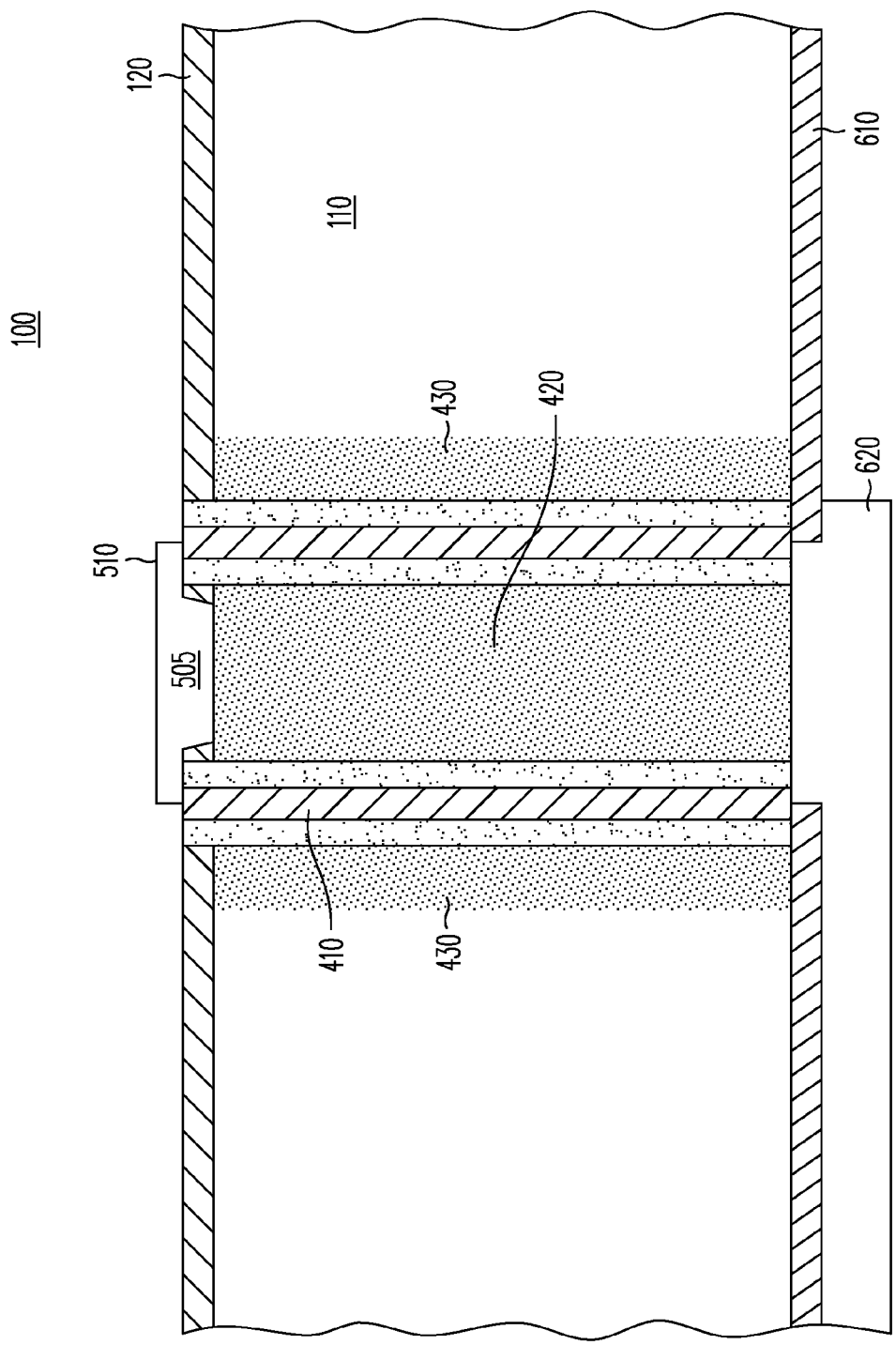
FIG. 6 is a simplified block diagram illustrating a cross-section of structure 100 in a step subsequent to that of FIG. 5 during fabrication of one example of the TSV, in accordance with embodiments of the present invention.

FIG. 6 is a simplified block diagram illustrating a cross-section of structure 100 in a step subsequent to that of FIG. 5 during fabrication of one example of the TSV, in accordance with embodiments of the present invention. As illustrated, substrate 110 has been subjected to backgrinding or polishing on the bottom surface to remove highly doped layer 310 deposited on the bottom of the ring-shaped trench and to expose a bottom surface of region 420. An interconnect buildup is performed on the bottom surface of substrate 110 that includes an insulating layer 610 and a conductive layer 620. Insulating layer 610 is patterned to expose the bottom surface of region 420, and conductive layer 620 is formed in contact with the bottom surface of region 420. In this manner, region 420 forms a conductive path, or via, between conductive layer 510 on the top surface of substrate 110 and conductive layer 620 on the bottom surface of substrate 110. Further, thermal oxide layer 410 forms an insulator between region 420 and the rest of substrate 110. These processes for backgrinding and forming the interconnect buildup can be performed using techniques known in the art.

In general, insulating layer 610 may include a dielectric material, such as silicon dioxide, silicon nitride, silicon oxynitride, or any combination of such layers to provide electrical isolation between substrate 110 and a conductive layer 620 subsequently formed upon insulating layer 610. Insulating layer 610 can be deposited or formed using techniques known in the art. In either case, an exemplary range of thickness for insulating layer 610 may generally be between approximately 50 µm and approximately 300 µm. Larger or smaller thicknesses for insulating layer 610, however, may be employed depending on the design specifications of the ensuing devices.

Subsequent to the formation of insulating layer 610, conductive layer 620 may be formed upon the insulating layer. Conductive layer may generally include any conductive material, such as but not limited to doped amorphous silicon, doped polysilicon, aluminum, copper, tantalum, titanium, tungsten, or any metal alloy, or silicide thereof or any material to be made conductive by subsequent implantations of dopants, such as undoped polysilicon, for example. In some embodiments, alloys of tungsten, such as a tungsten metal or tungsten silicide, may be advantageous due to the good thermal stability properties of tungsten. In other embodiments, it may be advantageous for conductive layer 620 to include amorphous silicon or polysilicon (either doped or doped by subsequent implantations of dopants). In particular, such materials may have similar processing properties as insulating materials and, thus may be more compatible with established techniques for processes slated to be performed subsequent to the formation of conductive layer 620.

Figure 7:
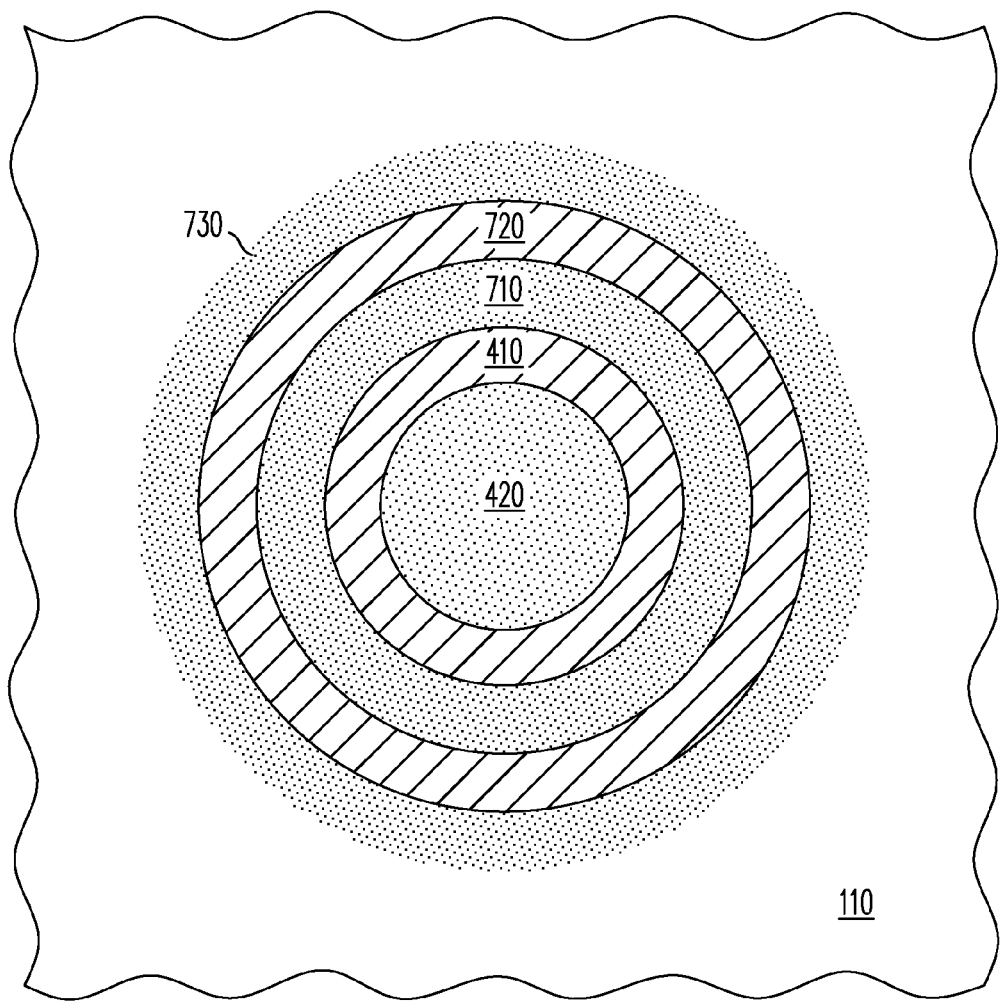
FIG. 7 is a simplified block diagram illustrating an alternative embodiment of the present invention.

The above embodiment discusses formation of a single conductive path as a through substrate via. A similar technique can be performed to form multiple concentric conductive paths through a substrate. As illustrated in FIG. 7, a second trench can be etched around the first trench with a ring of silicon left between the two trenches. As discussed above, a highly doped source layer (e.g., source layer 310) can be formed such that it coats surfaces of both trenches. A thermal oxide layer (e.g., thermal oxide layer 410) can be formed on top of the source layer, such that the thermal oxide layer fills the remaining gaps in the trenches. Formation of the thermal oxide layer, coupled with an optional additional drive-in diffusion step, results in diffusion of the dopants in the highly-doped source layer into the neighboring silicon. As illustrated, the diffusion results in not only a conductive core region 420 surrounded by an insulating layer 410, but also another conductive silicon region 710 surrounded by an insulating layer 720. By appropriate formation of conductors on the top and bottom surfaces, each of conducting core region 420 and conductive silicon region 710 can be used for transmission of separate signals between each major surface of the substrate.

Figure 8:
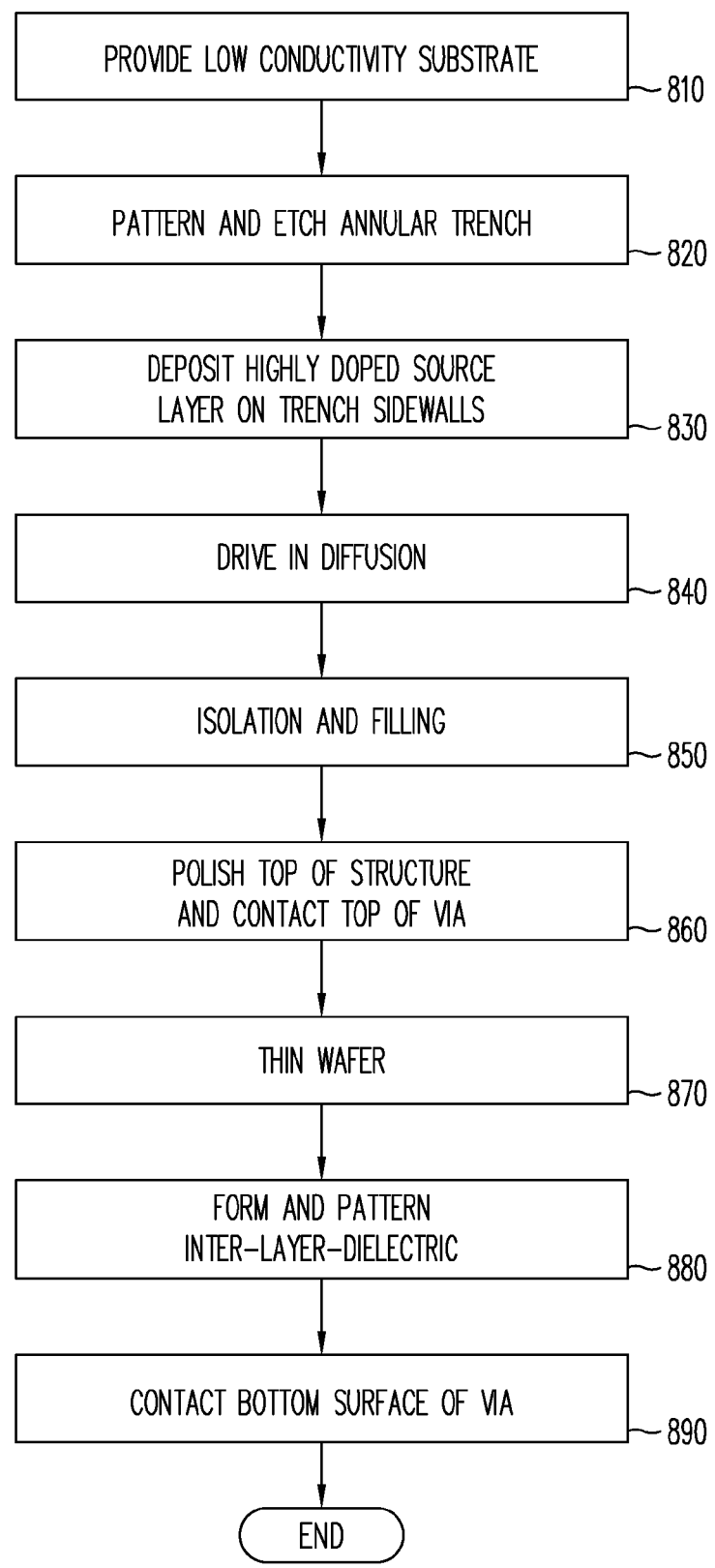
FIG. 8 is a simplified flow diagram summarizing the process for forming a through-silicon via, in accordance with embodiments of the present invention.

FIG. 8 is a simplified flow diagram summarizing the process for forming a through-silicon via, in accordance with embodiments of the present invention. As discussed above, the process begins with provision of a low conductivity substrate (810). The low conductivity substrate can be an undoped crystalline silicon wafer suitable for use in formation of semiconductor devices, such as microelectromechanical devices. A masking layer can be formed on a first major surface of the silicon wafer, where the masking layer is patterned in areas where the through-substrate vias are desired (820). As discussed above, the patterning provides an annular region where the etch is used to form a trench. Etching is then performed to form annular trenches where the TSVs are desired. Since the resulting structures of the etch are intended to have steep sides and high aspect ratio, embodiments anticipate use of a deep reactive ion etching process to form the trenches. But embodiments are not limited to a particular process for forming the trenches as long as appropriately steep sided structures can be formed.

After formation of the annular trenches, deposition of a highly doped source layer on the exposed surfaces is performed (830). The source layer has a sufficient concentration of dopant that the dopant will diffuse into the crystalline silicon of the cylinder at the core of the annular trenches to form a doping profile through the diameter of the cylinder.

The dopant in the source layer is then diffused into the silicon of the core cylinder through a drive-in diffusion process (840). The drive-in diffusion process can include heating the panel to about 1100 C in a nitrogen environment for a period of time and then continued during an isolation and filling step (850), during which more heat is applied. If the heating during the isolation and filling step is sufficient to generate a near-uniform doping profile within the core cylinder, then the separate heating step may not be needed. In some embodiments, it may be desirable to perform the diffusion steps for a sufficient amount of time to form a uniform doping profile across the radius of the cylindrical core.

An alternative embodiment provides for doping the core cylinder using a gaseous source of the dopant, rather than a formed source layer. The panel can be exposed to the gaseous dopant source and then heated to provide for the dopant to diffuse into the exposed surfaces. Embodiments of the present invention are not limited to the mechanism by which diffusion is performed.

Isolation and filling step (850) includes formation and growth of an oxide layer over and within the trenches with the goal of filling the remaining space in the trenches with oxide. Because the thermal oxide layer is being formed on a polysilicon layer, in embodiments where the source layer is formed, the thermal oxidation time to fill the trench is less than if the thermal oxide layer were formed on a crystalline silicon material. Time for formation of the thermal oxide layer is set to that needed for completing the trench fill, in order to avoid additional material stresses created by growing the thermal oxide layer beyond that needed for closing off the trench. In addition, the oxidation/thermal diffusion steps may result in a residual doped source layer, or may consume the entire doped source layer, or may partially oxidize the cylindrical core material.

Subsequent to formation of the thermal oxide, the first major surface of the wafer is polished and etched to expose conductive material at the top of the now conductive core cylinder (860). The polishing step removes at least the thermal oxide layer and source material layers formed on top of the wafer, thus electrically isolating the conductive core cylinders formed on the wafer. Etching can be used to remove insulative material on the top surface of the conductive core cylinders. A conductive contact can be formed on the exposed conductive surface. This can be done in a number of ways including deposition and patterning of conductive and dielectric layers, depending upon the application.

In order to form conductors on the other side of the conductive core cylinder, the second major surface of the wafer is thinned to remove source material formed on the bottom of the original trenches and to expose material of the conductive core cylinder (870). The thinning process can be performed using a backgrind or polishing step. This step also electrically isolates the conductive core cylinder from the remaining substrate material because of the surrounding insulating thermal oxide material. A buildup can be formed on the second major surface of the wafer with patterned interlayer dielectric material (880) and conductive layers used to contact the exposed conductive material of the core cylinder (890), using techniques known in the art.

Embodiments of the present invention provide a through-substrate via that has a highly conductive path with low resistance. Diffusion of the dopant into the single crystal silicon core of the TSV results in regions with much higher mobility (~100-1000 cm$^2$/v-sec) than for poly-silicon. In addition, by using a conductive source layer, an additional conductive region is provided and resistance is further lowered. Since the diffusion of the dopant into the core region can occur during the thermal oxidation process, the process can be performed and structures made with no additional process steps and therefore is inexpensive to include in a fabrication process. Further, use of a low-doped substrate, rather than a conductive substrate, is significantly less expensive and therefore saves costs. In addition, a low-doped substrate is transparent to infrared, which can aid in characterization f MEMS structures build using the substrate. Structurally, embodiments of the present invention provide a seam created during via closure in the middle of the insulating oxide layer, and not adjoining a conductive layer, this provides better resistance and greater reliability. In addition, the conductive center core of the TSV structure provides a larger area for contact that is found in prior art TSVs.

By now it should be appreciated that there has been provided a method for manufacturing a semiconductor device having a through substrate via. The method includes: etching an annular trench in a first major surface of a low-conductivity crystalline silicon substrate to form a cylindrical core surrounded by the annular trench; diffusing a dopant into the cylindrical core; forming a thermal oxide layer to fill the annular trench after diffusing the dopant; exposing a conductive region in contact with the cylindrical core on the first major surface of the substrate after diffusing the dopant and forming the thermal oxide layer; and exposing a conductive region in contact with the cylindrical core on a second major surface of the substrate after diffusing the dopant and forming the thermal oxide layer.

In one aspect of the above embodiment, diffusing the dopant into the cylindrical core further includes depositing a source layer comprising a high concentration of dopant on the substrate and annular trench walls, and thermally diffusing the dopant during a first heating process associated with said forming the thermal oxide layer. In a further aspect, diffusing the dopant into the cylindrical core further includes thermally diffusing the dopant during a second heating process preceding the first heating process. In a still further aspect, the second heating process includes exposing the semiconductor device to a nitrogen gas, and heating the semiconductor device to about 1150 C for up to four hours. In another aspect, the source layer includes a polysilicon layer doped with an n-type dopant. In a further aspect, the thermal oxide layer is formed on the polysilicon layer.

In another aspect of the above embodiment, diffusing the dopant into the cylindrical core includes exposing the semiconductor device to a gaseous dopant source, and heating the semiconductor device to a temperature sufficient to drive in the gaseous dopant into the cylindrical core. In a further aspect, the thermal oxide layer is formed on the crystalline core.

In another aspect of the above embodiment, etching the annular trench includes forming a mask layer on the first major surface of the substrate, exposing an annular region of the first major surface of the substrate through the mask layer, and performing a deep reactive ion etch to form the annular trench. In another aspect, exposing the conductive region in contact with the cylindrical core on the first major surface of the substrate includes polishing the first major surface to remove one or more of the thermal oxide layer, a source layer comprising a high concentration of dopant, and a mask layer. In still another aspect, the method further includes forming a conductive contact electrically coupled to the conductive region in contact with the cylindrical core on the first major surface of the substrate. In another aspect, exposing the conductive region in contact with the cylindrical core on the second major surface of the substrate includes performing a backgrind operation to expose a portion of the doped cylindrical core and to remove the thermal oxide layer in the bottom of the annular trench.

In another aspect of the above embodiment, the method further includes forming a conductive contact electrically coupled to the conductive region in contact with the cylindrical core on the second major surface of the substrate. In a further aspect, forming the conductive contact includes forming a dielectric layer on the second major surface, etching an opening in the dielectric layer to expose the conductive region in contact with the cylindrical core on the second major surface of the substrate, and forming a conductive layer in contact with the conductive region in contact with the cylindrical core on the second major surface of the substrate.

Another embodiment of the present invention provides a semiconductor device that includes a low conductivity crystalline silicon substrate having a first and second major surface, and a through-substrate via (TSV) formed in the substrate. The TSV includes: a conductive cylindrical core, extending from the first major surface of the substrate to the second major surface, and including a doped crystalline silicon; an insulative annular cylinder, formed around the conductive cylindrical core, extending from the first major surface of the substrate to the second major surface, and including silicon dioxide; and, a doped crystalline silicon annular cylindrical region, formed around the exterior of the insulative annular cylinder, extending from the first major surface of the substrate to the second major surface, and including a same dopant as the conductive cylindrical core.

In one aspect of the above embodiment, the semiconductor device further includes a first conductive contact electrically coupled to the conductive cylindrical core at the first major surface of the substrate, and a second conductor contact electrically coupled to the conductive cylindrical core at the second major surface of the substrate. In a further aspect, the semiconductor device further includes an interconnect built up on the second major surface of the substrate, where the interconnect includes the second conductor contact.

In another aspect of the above embodiment, the TSV further includes a doped annular cylinder, formed between the conductive cylindrical core and the insulative annular cylinder, extending from the first major surface of the substrate to the second major surface, and including polysilicon doped with the same dopant as the conductive cylindrical core. In a further aspect, the TSV includes a doped annular cylinder, formed between the insulative annular cylinder and the doped crystalline silicon annular cylindrical region, extending from the first major surface of the substrate to the second major surface, and including polysilicon doped with the same dopant as the conductive cylindrical core.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for manufacturing a semiconductor device having a through substrate via, the method comprising:
    etching an annular trench in a first major surface of a low-conductivity crystalline silicon substrate to form a cylindrical core surrounded by the annular trench;
    diffusing a dopant into the cylindrical core;
    forming a thermal oxide layer to fill the annular trench after said diffusing the dopant;
    exposing a conductive region in contact with the cylindrical core on the first major surface of the substrate after said diffusing the dopant and said forming the thermal oxide layer; and
    exposing a conductive region in contact with the cylindrical core on a second major surface of the substrate after said diffusing the dopant and said forming the thermal oxide layer.

2. The method of claim 1 wherein said diffusing the dopant into the cylindrical core further comprises:
    depositing a source layer comprising a high concentration of dopant on the substrate and annular trench walls; and
    thermally diffusing the dopant during a first heating process associated with said forming the thermal oxide layer.

3. The method of claim 2 wherein said diffusing the dopant into the cylindrical core further comprises:
    thermally diffusing the dopant during a second heating process preceding the first heating process.

4. The method of claim 3 wherein said second heating process comprises:
    exposing the semiconductor device to a nitrogen gas; and
    heating the semiconductor device to about 1150 C for up to four hours.

5. The method of claim 2 wherein the source layer comprises:
    a polysilicon layer doped with an n-type dopant.

6. The method of claim 5 wherein the thermal oxide layer is formed on the polysilicon layer.

7. The method of claim 1 wherein said diffusing the dopant into the cylindrical core comprises:
    exposing the semiconductor device to a gaseous dopant source; and
    heating the semiconductor device to a temperature sufficient to drive in the gaseous dopant into the cylindrical core.

8. The method of claim 7 wherein the thermal oxide layer is formed on the crystalline core.

9. The method of claim 1 wherein said etching the annular trench comprises:
    forming a mask layer on the first major surface of the substrate;
    exposing an annular region of the first major surface of the substrate through the mask layer; and
    performing a deep reactive ion etch to form the annular trench.

10. The method of claim 1 wherein said exposing the conductive region in contact with the cylindrical core on the first major surface of the substrate comprises:
    polishing the first major surface to remove one or more of the thermal oxide layer, a source layer comprising a high concentration of dopant, and a mask layer.

11. The method of claim 1 further comprising:
    forming a conductive contact electrically coupled to the conductive region in contact with the cylindrical core on the first major surface of the substrate.

12. The method of claim 1 wherein said exposing the conductive region in contact with the cylindrical core on the second major surface of the substrate comprises:

performing a backgrind operation to expose a portion of the doped cylindrical core and to remove the thermal oxide layer in the bottom of the annular trench.

13. The method of claim 1 further comprising:

forming a conductive contact electrically coupled to the conductive region in contact with the cylindrical core on the second major surface of the substrate.

14. The method of claim 13 wherein said forming the conductive contact comprises:

forming a dielectric layer on the second major surface;

etching an opening in the dielectric layer to expose the conductive region in contact with the cylindrical core on the second major surface of the substrate; and forming a conductive layer in contact with the conductive region in contact with the cylindrical core on the second major surface of the substrate.

15. The method of claim 1 further comprising:

etching an outer annular trench in the first major surface of the low-conductivity crystalline silicon substrate to form an annular crystalline silicon region between the annular trench and the outer annular trench, wherein the outer annular trench has a same center point as the annular trench;

diffusing the dopant into the annular crystalline silicon region at the same time as diffusing the dopant into the cylindrical core;

forming the thermal oxide layer further comprises filling the outer annular trench in the same step as said forming the thermal oxide layer to fill the annular trench;

exposing a conductive region in contact with the doped annular crystalline silicon region on the first major surface of the substrate after said diffusing the dopant and said forming the thermal oxide layer; and exposing a conductive region in contact with the doped annular crystalline silicon region on the second major surface of the substrate after said diffusing the dopant and said forming the thermal oxide layer.

* * * * *